United States Patent
Shen et al.

(10) Patent No.: US 7,509,598 B1
(45) Date of Patent: Mar. 24, 2009

(54) CLOCK BOOSTING SYSTEMS AND METHODS

(75) Inventors: Yinan Shen, Sunnyvale, CA (US); Song Xu, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/737,702

(22) Filed: Apr. 19, 2007

(51) Int. Cl.
  *G06F 17/50* (2006.01)
(52) U.S. Cl. .................... 716/2; 716/22; 716/6; 716/18
(58) Field of Classification Search .................... 716/2, 716/6, 18
  See application file for complete search history.

(56) References Cited

U.S. PATENT DOCUMENTS 6,763,513 B1 * 7/2004 Chang et al. .................. 716/14
6,952,813 B1 10/2005 Rahut

OTHER PUBLICATIONS

Altera, Stratix Device Handbook, Jan. 2005, vol. 1, 868 pages.
Xilinx, Virtex-4 User Guide, Mar. 21, 2006, 392 pages.
Altera, Max II Device Handbook, Mar. 2004, 330 pages.
Altera, Stratix II Device Handbook, Dec. 2005, vol. 1, 756 pages.
Xilinx Application Note, Using Digital Clock Managers (DCMs) in Spartan-3 FPGAs, Jan. 5, 2006, 68 pages.
John P. Fishburn, Clock Skew Optimization, IEEE Transactions on Computers, vol. 39, No. 7, Jul. 1990, 7 pages.
Actel Corporation Application Note, Clock Skew and Short Paths Timing, Mar. 2004, 13 pages.
Actel Corporation Application Note, Global Clock Networks in Actel Antifuse Devices, Jun. 2004, 12 pages.
Actel Corporation Application Note, Efficient Use of ProASIC Clock Trees, Aug. 2001, 8 pages.
Actel Corporation, Using Global Resources in Actel's Axcelerator Family, Aug. 2003, 7 pages.
Actel Corporation Technical Brief, Using the BUFD and INVD Delay Macros, Feb. 2001, 4 pages.
Actel Corporation Application Note, Static Timing Analysis, Using Designer's Timer, Jan. 2004, 19 pages.
Neves et al., Design methodology for synthesizing clock distribution network exploiting nonzero localized clock skew, IEEE Transactions on Very Large Scale Integration (VLSI) Systems, vol. 4, No. 2, Jun. 1996, 6 pages.
Hsieh et al., Department of Electrical and Computer Engineering, Clocking Optimization and Distribution in Digital Systems with Scheduled Skews, Journal of VISI Signal Processing Systems for Signal, Image and Video Technology, 16(2/3) Jun./Jul. 1997, 32 pages.

(Continued)

*Primary Examiner*—Thuan Do
(74) *Attorney, Agent, or Firm*—MacPherson Kwok Chen & Heid LLP; Greg J. Michelson (57) ABSTRACT

Systems and methods are disclosed herein to provide software clock boosting techniques. For example in one embodiment, a method of configuring a programmable logic device includes receiving routed data; performing a software clock boost operation on the routed data to determine and include one or more desired clock delays for circuit elements. The software clock boost operation may include performing a static timing analysis on the routed data; determining a list of the desired clock delays; and modifying the routed data to insert the desired clock delays.

16 Claims, 5 Drawing Sheets

OTHER PUBLICATIONS

Yeh et al., ECE Department, University of California, Skew-programmable Clock Design for FPGA and Skew-aware Placement, Proceedings of the 2005 ACM/SIGDA 13th International Symposium on Field-programmable gate arrays, Monterey, California, 8 pages.

Singh et al., Dept. of Electrical and Computer Engineering, University of Toronto, Constrained clock shifting for field programmable gate arrays, Proceedings of the 2005 ACM/SIGDA 10th International Symposium on Field-Programmable Gate Arrays, Monterey, California, Feb. 24-26, 2002, 6 pages.

Altera, Max II Device Handbook, Mar. 2004, 330 pages.

* cited by examiner

CLOCK BOOSTING SYSTEMS AND METHODS

TECHNICAL FIELD

The present invention relates generally to electrical circuits and, more particularly, to programmable logic devices and clock boosting techniques.

BACKGROUND

A programmable logic device (PLD), such as for example a field programmable gate array (FPGA) or a complex programmable logic device (CPLD), generally has an array of logic blocks that may be connected via a programmable routing structure. For example, an FPGA may have logic blocks that include look-up tables, multiplexers, and registers (e.g., flip-flops). Because many customer designs require synchronized circuits, the typical FPGA also provides one or more low and/or zero skew clock distribution networks (also known as clock trees) to drive the clock inputs of the logic blocks.

After place and route of the user's design, the maximum frequency of the design may be calculated based on the maximum logical path delays between registers of the logic blocks. Clock boosting techniques (also referred to as clock cycle stealing) may also be applied, which for example introduce clock skew to increase timing margins. However, conventional approaches to clock boosting typically include special circuit components (i.e., hardware) within the PLD, such as additional clock distribution networks or special programmable delay elements. These conventional approaches typically result in additional manufacturing costs, require additional silicon area to implement, and/or reduce the logic density or increase the size of the PLD.

As a result, there is a need for improved clock boosting techniques for PLDs.

SUMMARY

In accordance with one embodiment of the present invention, a programmable logic device includes a plurality of logic blocks; a plurality of registers corresponding to the plurality of logic blocks; configuration memory adapted to store configuration data for configuring the programmable logic device; a general routing network adapted to route signals among the logic blocks and having a plurality of routing wires; and a clock distribution network adapted to route clock signals among the logic blocks and having a plurality of routing wires, wherein at least one clock signal path is provided within the programmable logic device from a clock source to one of the registers via a routing wire of the clock distribution network and a routing wire of the general routing network.

In accordance with another embodiment of the present invention, a method of configuring a programmable logic device includes receiving routed data and performing a software clock boost operation on the routed data to determine and include one or more desired clock delays for circuit elements. The software clock boost operation may include performing a static timing analysis on the routed data; determining a list of the desired clock delays; and modifying the routed data to insert the desired clock delays.

In accordance with another embodiment of the present invention, a computer-readable medium on which is stored a computer program for performing a method which includes receiving routed data and performing a software clock boost operation on the routed data to determine and include one or more desired clock delays for circuit elements. The software clock boost operation may include performing a static timing analysis on the routed data; determining a list of the desired clock delays; and modifying the routed data to insert the desired clock delays.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
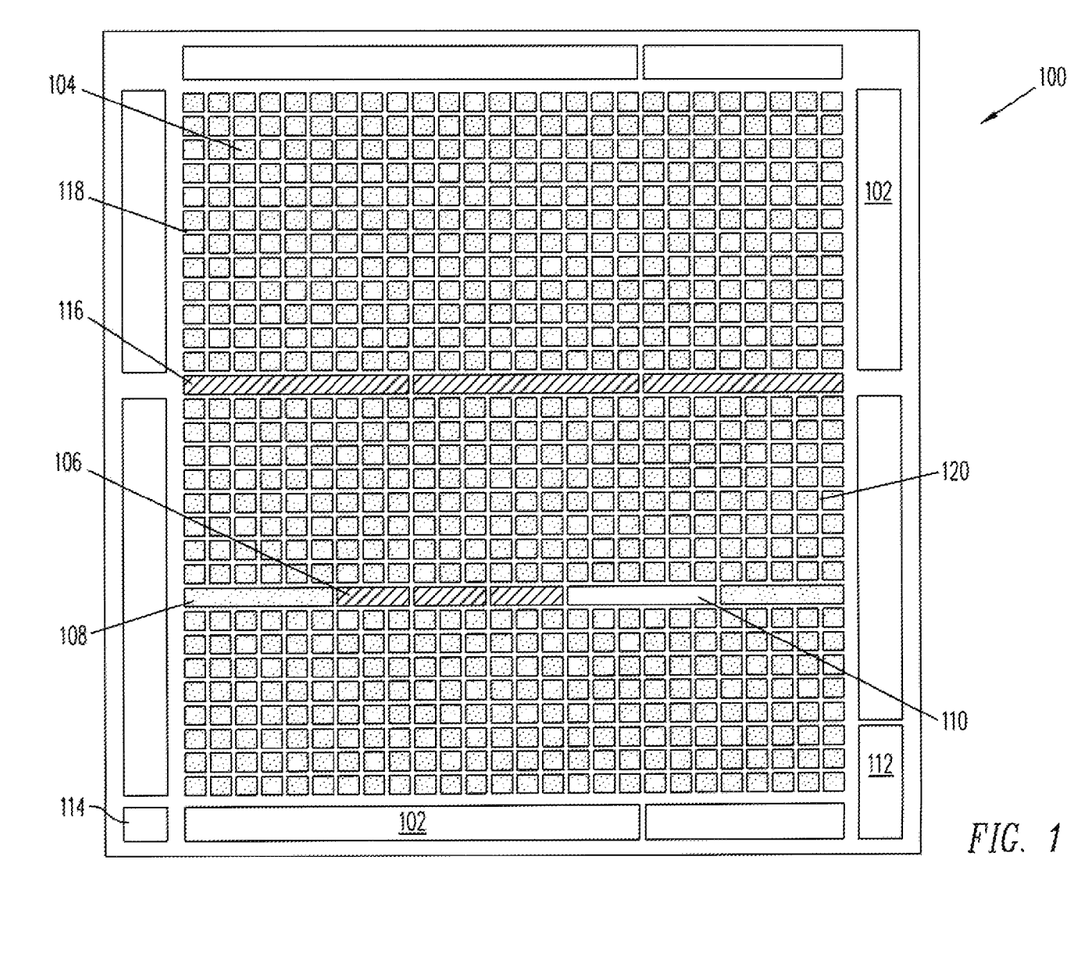
FIG. 1 shows a block diagram illustrating a programmable logic device in accordance with an embodiment of the present invention.

FIG. 1 shows a block diagram illustrating a programmable logic device (PLD) 100 in accordance with an embodiment of the present invention. PLD 100 (e.g., an FPGA, a CPLD, or a field programmable system on a chip (FPSC)) generally includes input/output (I/O) blocks 102 and logic blocks 104 (e.g., also referred to as programmable logic blocks (PLBs), configurable logic blocks (CLBs), logic array blocks (LABs), programmable functional units (PFUs), programmable logic cells (PLCs), etc.). I/O blocks 102 provide I/O functionality (e.g., supports one or more I/O and/or memory interface standards) for PLD 100, while programmable logic blocks 104 provide logic functionality (e.g., LUT-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, encryption, and/or error detection), a configuration port 112, configuration memory 114, special function blocks 116 (e.g., DSP blocks or other forms of multiply and accumulate circuit functionality), routing resources 118, and/or a clock distribution network 120. It should be understood that the number and placement of the various elements, such as I/O blocks 102, logic blocks 104, memory 106, clock-related circuitry 108, configuration logic 110, configuration port 112, configuration memory 114, special function blocks 116, routing resources 118, and clock distribution network 120 is not limiting and may depend upon the desired application.

For example, special function blocks 116 are optional as are various other elements (e.g., memory 106) and may not be required for a desired application. As a specific example, PLD 100 may generally include logic blocks 104, clock-related circuitry 108, configuration memory 114, routing resources 118, and clock distribution network 120. Furthermore, it should be understood that the elements are illustrated in block form for clarity and that certain elements, such as configuration memory 114 for example, would typically be distributed throughout PLD 100, such as in and between logic blocks 104, to perform their conventional functions (e.g., storing configuration data that configures PLD 100).

Configuration port 112 may be used for programming memory 106 and/or configuration memory 114 of PLD 100 as would be understood by one skilled in the art. For example, configuration port 112 may include a programming port, such as a central processing unit (CPU) port (also referred to as a peripheral data port or a sysCONFIG programming port) and/or a programming port such as a joint test action group (JTAG) port (e.g., by employing standards such as Institute of Electrical and Electronics Engineers (IEEE) 1149.1 or 1532 standards). Configuration port 112 typically may be included to receive configuration data and commands.

Routing resources 118, which are distributed within PLD 100, represent the routing network for a conventional general interconnect routing fabric. Clock distribution network 120, which is also distributed within PLD 100, represents one or more separate clock distribution networks for distributing signals (e.g., clock signals) as would be understood by one skilled in the art.

In accordance with one or more embodiments of the present invention, clock boosting techniques are disclosed that use software processes (e.g., referred to herein as software clock boosting (SCB) or clock cycle stealing) to improve PLD performance. For example, the software process may provide a post process of a current route to determine an optimal clock skew for each synchronized flip flop, and then modify the current route to insert unused general routing resources into the clock distribution network to provide the pre-determined clock skews. Thus, based on the placed and routed design, the software process (i.e., software approach) achieves clock boosting by inserting unused wires into certain portions of the clock distribution network to improve performance of the design without special hardware components (e.g., additional clock distribution networks or programmable delay element circuits) as with conventional clock boosting approaches. Furthermore in accordance with an embodiment of the present invention, the impact of clock delay uncertainty may be reduced by inserting general interconnect routing wires into the clock distribution network, such as at one or more ends of the clock signal paths that comprise the network (e.g., just prior to the synchronized flip flop).

Figure 2A:
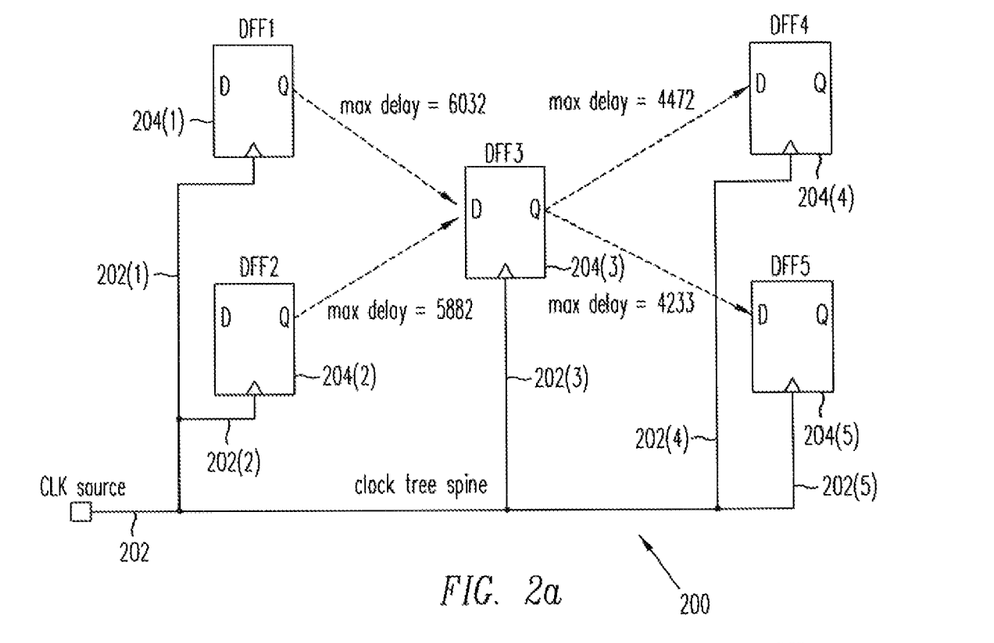
FIGS. 2a and 2b show block diagrams illustrating a software clock boosting technique in accordance with an embodiment of the present invention.
Figure 2B:
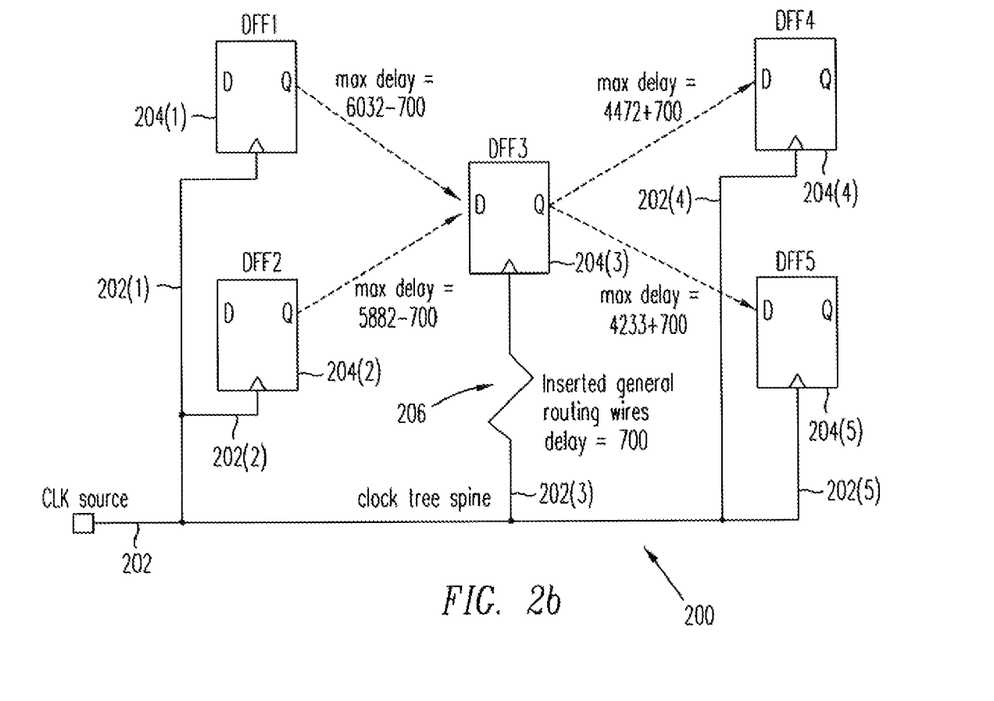

For example, FIGS. 2a and 2b show block diagrams of circuit 200 illustrating a software clock boosting (SCB) technique in accordance with an embodiment of the present invention. Circuit 200 may represent a portion of a PLD (e.g., PLD 100) and may represent a portion of a typical industry design that may be implemented by a user within the PLD.

Circuit 200 is shown in FIG. 2a receiving a clock signal (labeled CLK source) from a clock distribution network 202, with the clock signal (CLK) provided to the clock input pins of a number of registers 204(1) through 204(5) (e.g., flip flops labeled DFF1 through DFF5, respectively) through clock signal paths 202(1) through 202(5).

In FIG. 2a, register 204(3) has two input data paths and two output data paths represented by dashed lines, with exemplary input path delays shown as 6032 ps and 5882 ps, respectively, with the longest path delay between registers (e.g., D flip flops) being 6032 ps. In accordance with an embodiment of the present invention, SCB techniques may be applied to circuit 200 (FIG. 2a) to lengthen clock signal path 202(3) and thereby add a 700 ps delay to the time required for the clock signal to reach the clock input pin of register 204(3). As shown in FIG. 2b, the SCB approach lengthens path 202(3) and delays the clock signal's arrival by inserting unused wires 206 (e.g., from the general interconnect of routing resource 118 of FIG. 1) into the network path. Consequently, register 204(3) is clocked later than before and the time between its clocking and the arrival of data from register 204(1) is reduced by 700 ps. The longest path delay is thus shortened to 5332 ps (6032 ps-700 ps). With the application of the SCB approach, this design implementation portion of the PLD may be improved (e.g., a 13% fmax improvement), without adding the additional specialized circuitry of conventional clock boosting approaches.

Figure 3:
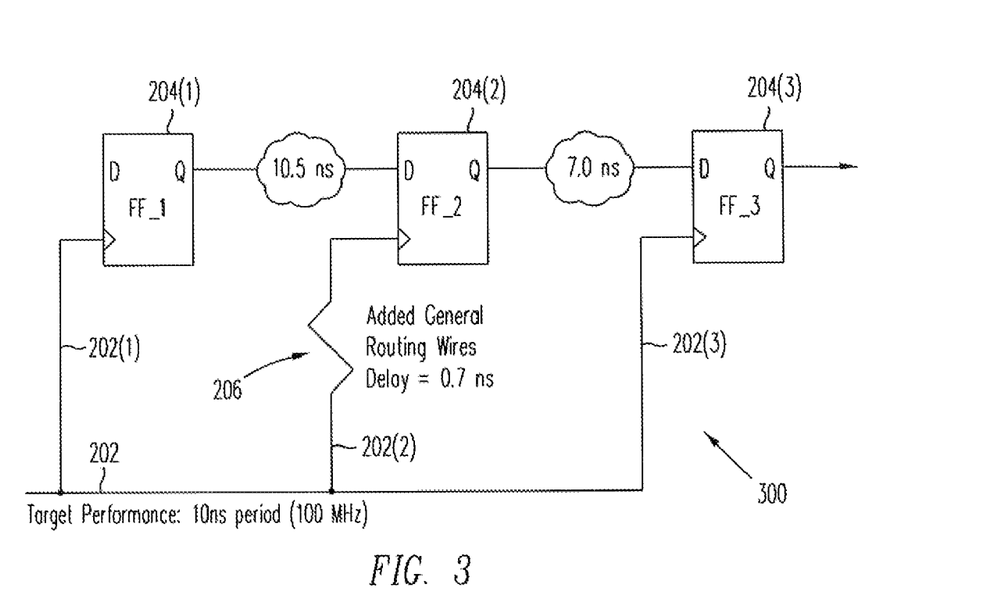
FIG. 3 shows a block diagram illustrating a software clock boosting technique in accordance with an embodiment of the present invention.

As another example, FIG. 3 shows a block diagram of a circuit 300 illustrating a SCB technique in accordance with an embodiment of the present invention. Circuit 300 may represent a portion of a PLD (e.g., PLD 100) and may represent a portion of a typical industry design that may be implemented by a user within the PLD. Circuit 300, similar to circuit 200 (FIG. 2a), receives the clock signal (CLK source) from clock distribution network 202, with the clock signal (CLK) provided to the clock input pins of registers 204(1) through 204(3) through clock signal paths 202(1) through 202(3).

In this example, the SCB approach is applied to introduce clock skew for register 204(2) (e.g., the target flip flop) to increase a setup margin. The two register-to-register transfers (i.e., register 204(1) to 204(2) and register 204(2) to 204(3)) both need to meet a 10 ns timing period constraint. By applying the SCB approach, clock signal path 202(2) may be lengthened by inserting unused wires 206 (e.g., from unused general interconnect routing resources) into the network path to add a delay of 700 ps to the time required for the clock signal to reach the clock input pin of register 204(2). Consequently, the first register transfer (i.e., register 204(1) to 204 (2)) will make its timing period constraint with a new minimum period of 9.8 ns (10.5 ns-0.7 ns) and the second register transfer (i.e., register 204(2) to 204(3)) will make its timing period constraint with a new minimum period of 7.7 ns.

In general, the SCB approaches disclosed herein may be applied to every synchronized register within the PLD. The SCB approach may use a post process (e.g., after the regular router has completed) to find the optimal clock skew for each register, and then insert unused general routing resources (e.g., wires) into the clock distribution network to provide the desired additional clock skew. As an example, the SCB approach may be implemented within a software SCB tool (e.g., an automated software tool) that may be applied to a placed and routed design to assist in meeting setup constraints and improve performance of the design by introducing delays to as many target registers as needed to meet timing constraints (e.g., by borrowing from the slow path setup time). Furthermore, the SCB approach in an embodiment may provide the desired delays by inserting unused general routing resources into the clock signal path for each of the targeted registers (e.g., every synchronized flip-flop) to provide the desired additional clock skew. As an example, the SCB approach may provide the ability to borrow clock cycle time from one easily-met path to provide this time to a difficult-to-meet path (e.g., the software will search for an unused general routing resource with the proper delay to fit the timing requirements as needed).

Overall, the problem of improving the performance of a synchronous digital system by adjusting the path delays of the clock signal from the clock source to individual flip-flops has been investigated and documented in various publications. For example, it has been determined that by introducing non-zero clock skews, where the clock skew is defined as variations in the delays from the clock source to the different flip-flops of the system, the maximum frequency of the clock for a sequential circuit may be boosted (and thus referred to as clock boosting or clock cycle stealing). Specifically, formal methods to resolve the clock skew optimization problem to determine the minimum clock period and the optimal clock skews were formulated as a linear program problem as described below in reference to the following equations.

Figure 4:
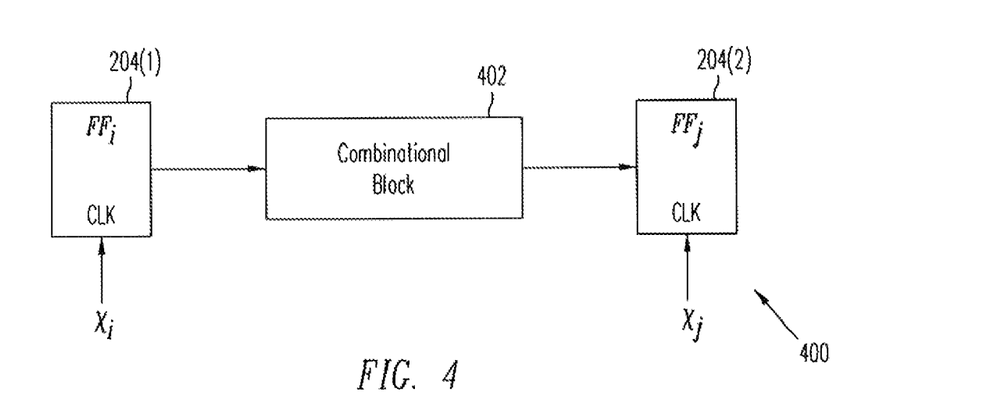
FIG. 4 shows a block diagram for illustrating a software clock boosting technique in accordance with an embodiment of the present invention.

For example, FIG. 4 shows a block diagram of a circuit 400 for illustrating a software clock boosting technique in accordance with an embodiment of the present invention. Circuit 400 (e.g., a sequential circuit) includes a combinational block 402 (e.g., a logic block), with register 204(1) (e.g., a flip flop labeled $FF_i$) at the input and register 204(2) (e.g., a flip flop labeled $FF_j$) at the output of the combinational block 402. Variables $x_i$ and $x_j$ represent the delays from a clock source to the clock input pins of register 204(1) and 204(2), respectively.

Because there may exist multiple paths from register 204(1) to register 204(2), let MIN(i,j) and MAX(i,j) be the minimum and maximum delays of these paths, respectively. In order to let a register operate correctly when the clock edge arrives at time x, a stable input data must be present during the time interval ($x-t_{SETUP}$, $x+t_{HOLD}$), where the constant $t_{SETUP}$ and $t_{HOLD}$ are the setup times and the holding times, respectively, for registers 204(1) and 204(2). The uncertainty of the clock path delays may also be taken into consideration. For example, there are defined two constants, $0 < a \leq 1 \leq b$, with the property that if the nominal clock delay to a flip-flop is x, then the actual clock delay $x_i$ can vary from clock edge to clock edge, but must always fall in the interval $a*x \leq x_i \leq b*x$. The range [a, b] is referred to as the uncertainty of the device, which may result from device (e.g., PLD) process variations, timing model and calculation variations, etc., with smaller uncertainty ranges providing more accurate path delays.

To avoid double-clocking between registers 204(1) and 204(2), the data signal at register 204(1) must arrive at register 204(2) no earlier than a period of time $t_{HOLD}$ after the latest possible arrival of the clock edge. The earliest that the clock edge can arrive at register 204(1) is $a*x_i$; with the fastest propagation from register 204(1) to register 204(2) being MIN(i,j) and the latest arrival time of the clock at register 204(2) is $b*x_j$. Thus, these parameters are set forth as in equation (1).

$$a*x_i + MIN(i,j) \geq b*x_j + t_{HOLD} \tag{1}$$

To avoid zero-clocking, the data signal at register 204(1) must arrive at register 204(2) no later than $t_{SETUP}$ before the earliest arrival of the next clock edge. The latest that the clock edge can arrive at register 204(1) is $b*x_i$, with the slowest propagation from register 204(1) to register 204(2) being MAX(i,j), the clock period being P, and the earliest arrival time of the next clock edge at register 204(2) being $a*x_j+P$.

Thus, these parameters are set forth as in equation (2).

$$b*x_i + t_{SETUP} + MAX(i,j) \leq a*x_j + P \tag{2}$$

Thus, the clock skew optimization may be formulated as the following linear program, where P is minimized subject to equations (3) and (4), for i,j=1, ..., L, where it is assumed that there are L registers associated with the clock.

$$a*x_i + MIN(i,j) \geq b*x_j + t_{HOLD} \tag{3}$$

$$b*x_i + t_{SETUP} + MAX(i,j) \leq a*x_j + P \tag{4}$$

Figure 5:
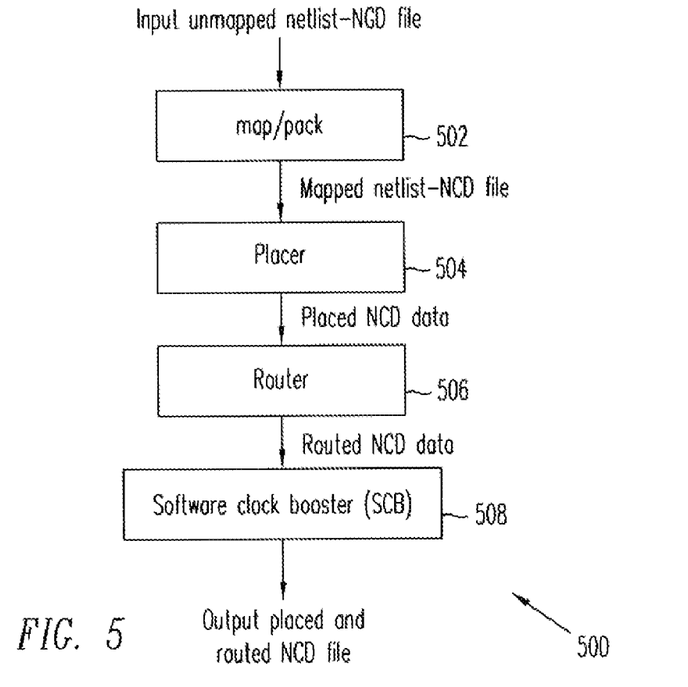
FIG. 5 shows a flowchart illustrating a software clock boosting technique in accordance with an embodiment of the present invention.

This analysis may be employed to provide software clock boosting (SCB) techniques, in accordance with one or more embodiments of the present invention. For example, FIG. 5 shows a flowchart 500 illustrating an SCB technique in accordance with an embodiment of the present invention. Flowchart 500 illustrates a typical PLD physical design flow (e.g., map, place, and route), but with the addition of SCB post route optimization. Flowchart 500, for example, may represent software operations performed by a software design tool (e.g., a computer program for execution by a computer), stored on a computer-readable medium, for generating configuration data and programming the PLD, as would be understood by one skilled in the art.

Specifically as an example, an unmapped netlist (e.g., as an ngd file) is provided and map/pack operation (block 502) is performed to provide a mapped netlist (e.g., as an ncd file), then a placer operation (block 504) is performed to provide placed data (e.g., as placed ncd data), and then a router operation (block 506) is performed to provided routed data (e.g., as routed ncd data). In accordance with an embodiment of the present invention, an SCB operation (block 508) is then performed to apply SCB to the data as disclosed herein and provide placed and routed data (e.g., provide placed and routed ncd file as output). Thus, after the design is completely placed and routed, an SCB operation (block 508) will be called to do further optimization to boost performance.

Figure 6:
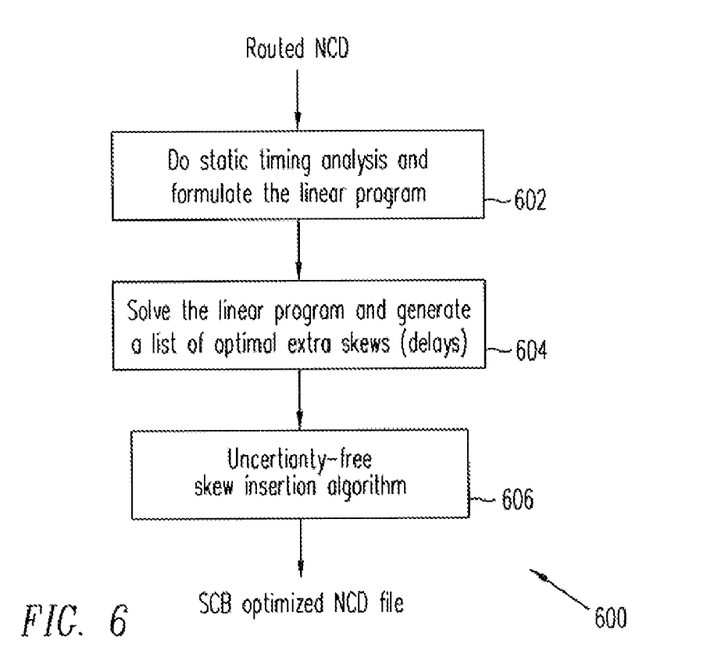
FIG. 6 shows a flowchart illustrating exemplary details for the software clock boosting technique of FIG. 5 in accordance with an embodiment of the present invention.

As an example, FIG. 6 shows a flowchart 600 illustrating exemplary details for SCB operation (block 508) of FIG. 5 in accordance with an embodiment of the present invention. Flowchart 600 provides the SCB flow by employing a static timing analyzer to perform static timing analysis to a completely routed design to obtain all minimum and maximum path delays required (e.g., as set forth in equations (3) and (4)) and formulate the linear program (block 602).

The linear program is then solved and a list of optimal extra skews (delays) is generated (block 604). For example, the constraints of equations (3) and (4) may be built and a mathematical method such as the Bellman-Ford algorithm may be used to solve the optimization problem as would be understood by one skilled in the art, with the solutions to the optimization problem providing the optimal extra skews (delays). The clock period of the design may also be minimized when inserting these extra skews to connections from clock source to individual clock input pins of registers. In accordance with an embodiment of the present invention, the predetermined skews may be inserted using our uncertainty-free skew insertion algorithm (block 606).

The uncertainty-free skew insertion algorithm (block 606) inserts extra skews (delays) to connections from clock source to clock input pins of registers associated with a clock signal. For example for a PLD, the clock signal paths from a clock source (e.g., clock signal (CLK source) of FIGS. 2 and 3) to clock input pins of registers may be implemented using dedicated routing wires of a clock distribution network (e.g., clock distribution network 120 of FIG. 1) and/or interconnect routing wires (e.g., routing resources 118 of FIG. 1). The dedicated routing wires of the clock distribution network may provide certain advantages as the clock distribution network is designed to distribute clock signals to every register with near zero skew. Therefore, because the clock distribution network is regular and the skews of the clock distribution network are balanced, it may be possible to obtain accurate delay information for the clock signals, and therefore keep the delay uncertainty low.

Alternatively, the clock signal paths may also be implemented by using only general routing resources (e.g., routing resources 118 of FIG. 1) rather than using the dedicated wires of a clock distribution network. For example, general routing resources such as segment wires (e.g., interconnect segment wires of length 1, 2, 6, etc., depending upon PLD type) may be implemented as clock signal paths to route the clock signals. The general routing resources are typically more abundant than dedicated clock distribution network resources in a PLD and therefore may be used to route clock signals when no clock distribution network resources are available.

However, there may be certain drawbacks associated with the general routing resource approach. For example, when a clock signal is routed through general routing resource wires, the clock skew may not be easily controlled, and thus may be difficult to obtain accurate delay information. As a specific example, the flexibility and irregularity of the general routing resource wires and the fanout of the general routing resource structure may result in a great deal of delay uncertainty. In accordance with an embodiment of the present invention, and as discussed further herein, the uncertainty-free skew insertion algorithm (block 606) may take advantage of both approaches (i.e., use the clock distribution network and/or the general routing network) to provide the extra desired clock skews, while maintaining the delay uncertainty as small as possible.

As an example, assume that a clock signal is routed solely through the signal paths of a clock distribution network. The delay from clock source to clock input pins of registers associated with the clock is a constant, referred to as $d_{clocktree}$. After applying the clock skew optimization (e.g., uncertainty-free skew insertion algorithm block 606) to this clock, we find that the optimal delay from clock source to a clock input pin of a certain register is $d_{optimal}$, with $d_{optimal} > d_{clocktree}$. Thus, an extra clock skew of $d_{skew}$ should be added to the current clock signal path from clock source to this clock input pin, as set forth in equation (5).

$$d_{skew} = d_{optimal} - d_{clocktree}. \quad (5)$$

As noted, the delay of the general routing wires may be employed to provide the required extra clock skew, $d_{skew}$. In accordance with an embodiment of the present invention, these general routing wires are preferably inserted at the end of the current clock signal path, where the path connects to the clock input pin of the register. Consequently, the clock signal is delivered with a delay of $d_{clocktree}$ to clock input pins of registers that do not require extra skew and with a delay of $d_{clocktree}$ plus $d_{skew}$ to the clock input pin of the certain register that requires extra skew. Thus, the clock distribution network delivers an accurate, near zero skew to clock input pins, while general routing wires may be inserted into clock signal paths of a clock distribution network to deliver desired extra skew. The length and/or number of general routing wires inserted may be varied as needed, to provide a good approximation to the required extra skew. Furthermore, by inserting the general routing wire at the end of the clock signal path, the impact from delay uncertainty may be minimized.

Figure 7:
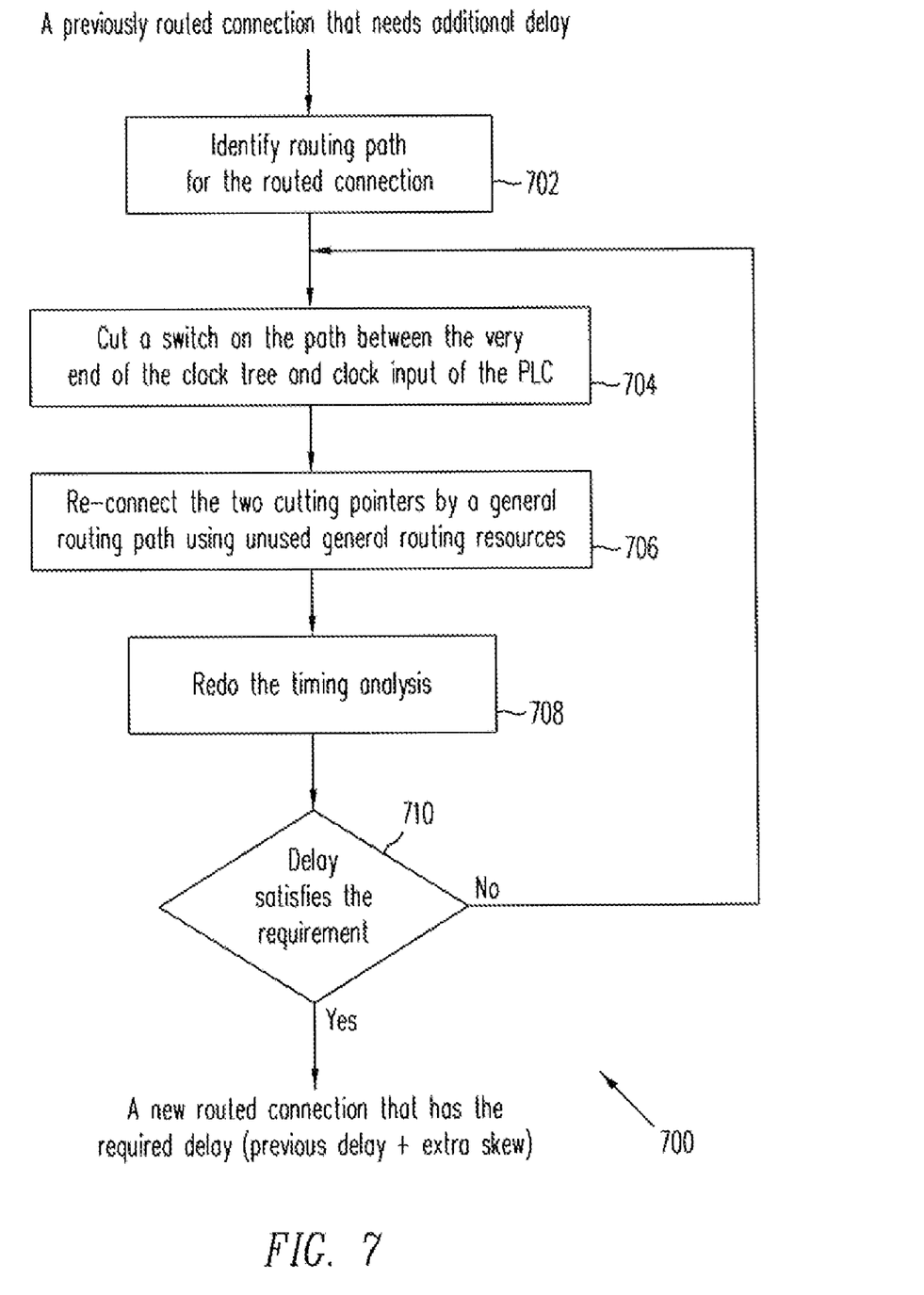
FIG. 7 shows a flowchart illustrating exemplary details for the software clock boosting technique of FIG. 6 in accordance with an embodiment of the present invention.

FIG. 7 shows a flowchart 700 illustrating exemplary details for the uncertainty-free skew insertion algorithm (block 606) of FIG. 6 in accordance with an embodiment of the present invention. As shown in flowchart 700, the uncertainty-free skew insertion algorithm may be applied to a previously routed connection which has been determined to need additional clock skew. The previously routed connection (e.g., through the clock distribution networks) is examined to identify the routing path from clock source to the clock input pin of the register or logic block (block 702). A switch is cut on the routing path between the very end of the clock distribution networks and the clock input of the register or logic block (block 704) and the two cutting pointers are reconnected with a general routing path using only unused general routing resources (block 706). Timing analysis is performed (block 708) to determine if the delay of the extended general routing path sufficiently provides the required extra clock skew and, if so, then the uncertainty-free skew insertion algorithm ends (for this routing path) and a new routed connection having the additional delay is provided. If the additional delay added does not satisfy the timing requirement, then the process may be repeated (e.g., blocks 704 through 708) until the desired amount of delay is provided by the general routing path that satisfies the extra clock skew requirement.

Systems and methods are disclosed herein to provide software clock boosting techniques. For example, in accordance with an embodiment of the present invention, a clock boosting technique is disclosed that uses a software process (referred to herein as software clock boost (SCB)) to provide clock boosting for PLDs. In accordance with an embodiment, the software process may be employed as a post process of current router algorithms to find the optimal clock skew for each synchronized flip-flop and insert unused general routing resources into the clock distribution network to provide the pre-determined clock skews. In accordance with some embodiments, the impact of clock delay uncertainty may be minimized by inserting general routing wires at the very end of the clock distribution network structure (e.g., between the clock distribution network and the flip-flop).

Consequently, rather than requiring the implementation of special hardware components (requiring additional cost and silicon area) as with some conventional approaches, techniques are disclosed herein to use software processes, which may use the unused general wires to achieve the desired clock boosting. Simulation and experimental results indicate many industry designs may benefit (e.g., six percent fmax improvement with less than three percent additional compiler time) by using the techniques disclosed herein. The results also indicate that the techniques disclosed herein are robust for different syntheses venders, with or without retiming mapping, and with different map, place, and route options.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A method of configuring a programmable logic device comprising:
    receiving routed data;
    performing a software clock boost operation on the routed data to determine and include one or more desired clock delays for circuit elements, wherein the software clock boost operation comprises:
        performing a static timing analysis on the routed data;
        determining a list of the desired clock delays; and modifying the routed data to insert one or more routing wires to provide the desired clock delays; wherein the modifying comprises cutting a switch on a routed connection of the routed data.

2. The method of claim 1, further comprising:
receiving an unmapped netlist;
mapping the unmapped netlist to provide a mapped netlist;
placing the mapped netlist to provide placed data; and
routing the placed data to provide the routed data.

3. The method of claim 2, wherein the mapping comprises performing a software mapper operation, the placing comprises performing a software placer operation, and the routing comprises performing a software router operation, and wherein the software clock boost operation provides a placed and routed output data file.

4. The method of claim 1, wherein the circuit elements comprise synchronized registers.

5. The method of claim 1, wherein the performing further comprises formulating a linear program, and wherein the determining further comprises solving the linear program.

6. The method of claim 1, wherein the modifying further comprises:
identifying a clock signal path within the routed data; and
inserting unused general routing resources as the routing wire within the clock signal path.

7. The method of claim 1, wherein the modifying further comprises:
identifying the routed connection within the routed data as providing a clock signal; and
inserting an unused wire of general routing resources as the routing wire between the routed connection and the corresponding circuit element.

8. The method of claim 1, wherein the modifying further comprises:
identifying the routed connection within the routed data; and
inserting unused general routing resources as the routing wire within the routed connection between the routed connection and the corresponding circuit element.

9. The method of claim 8, wherein the unused general routing resources comprise interconnect wires.

10. The method of claim 1, further comprising:
repeating the static timing analysis after the modifying;
providing the routed data with the desired clock delays if the modifying was successful; and
repeating the modifying if the modifying was not successful.

11. The method of claim 1, wherein the modifying comprises a skew insertion algorithm, and wherein the software clock boost operation provides desired clock skew for the circuit elements that comprise synchronized registers.

12. A computer-readable medium on which is stored a computer program for performing a method comprising:
receiving routed data;
performing a software clock boost operation on the routed data to determine and include one or more detailed clock delays for circuit elements, wherein the software clock boost operation comprises:
performing a static timing analysis on the routed data;
determining a list of the desired clock delays; and
modifying the routed data to insert routing wires to provide the desired clock delays; wherein the modifying comprises cutting one or more switches to insert the routing wires.

13. The computer-readable medium of claim 12, wherein the method further comprises:
receiving an unmapped netlist;
mapping the unmapped netlist to provide a mapped netlist;
placing the mapped netlist to provide placed data; and
routing the placed data to provide the routed data.

14. The computer-readable medium of claim 12, wherein the modifying further comprises:
identifying a clock signal path within the routed data; and
inserting unused general routing resources as the routing wire within the clock signal path.

15. The computer-readable medium of claim 12, wherein the modifying further comprises:
identifying a routed connection within the routed data; and
inserting unused general routing resources as the routing wire within the routed connection between the routed connection and the corresponding circuit element, wherein the unused general routing resources comprise interconnect wires.

16. The computer-readable medium of claim 12, wherein the method further comprises:
repeating the static timing analysis after the modifying;
providing the routed data with the desired clock delays if the modifying was successful; and
repeating the modifying if the modifying was not successful.

* * * * *

UNITED STATES PATENT AND TRADEMARK OFFICE
CERTIFICATE OF CORRECTION

PATENT NO.       : 7,509,598 B1                                                    Page 1 of 1
APPLICATION NO.  : 11/737702
DATED            : March 24, 2009
INVENTOR(S)      : Yinan Shen It is certified that error appears in the above-identified patent and that said Letters Patent is hereby corrected as shown below:

Col. 10, line 11 (claim 12): change "data to determine and include one or more detailed clock delays" to --data to determine and include one or more desired clock delays--

Signed and Sealed this

Twelfth Day of January, 2010

David J. Kappos
*Director of the United States Patent and Trademark Office*